United States Patent
Umeda et al.

(10) Patent No.: US 10,920,482 B2
(45) Date of Patent: Feb. 16, 2021

(54) GLASS BUILDING MATERIAL

(71) Applicant: KANEKA CORPORATION, Osaka (JP)

(72) Inventors: Kazuhiko Umeda, Tokyo (JP); Nobusato Kobayashi, Tokyo (JP); Seiichi Kinoshita, Tokyo (JP); Naoki Kadota, Osaka (JP); Hideki Matsuo, Osaka (JP); Tsukasa Makino, Osaka (JP); Nobuhisa Ohta, Osaka (JP); Akihiko Nakajima, Osaka (JP)

(73) Assignee: KANEKA CORPORATION, Osaka (JP)

(*) Notice: Subject to any disclaimer, the term of this patent is extended or adjusted under 35 U.S.C. 154(b) by 0 days.

(21) Appl. No.: 16/335,173

(22) PCT Filed: Sep. 20, 2017

(86) PCT No.: PCT/JP2017/033822
§ 371 (c)(1),
(2) Date: Mar. 20, 2019

(87) PCT Pub. No.: WO2018/056286
PCT Pub. Date: Mar. 29, 2018

(65) Prior Publication Data
US 2019/0211617 A1 Jul. 11, 2019

(30) Foreign Application Priority Data
Sep. 20, 2016 (JP) .............................. JP2016-182812

(51) Int. Cl.
E06B 5/00 (2006.01)
E06B 3/66 (2006.01)
(Continued)

(52) U.S. Cl.
CPC ................. *E06B 5/00* (2013.01); *E06B 3/66* (2013.01); *H01L 31/048* (2013.01); *H01L 31/054* (2014.12); *Y02E 10/52* (2013.01)

(58) Field of Classification Search
CPC . E06B 5/00; E06B 3/66; H01L 31/048; H01L 31/054; H01L 31/0488;
(Continued)

(56) References Cited

U.S. PATENT DOCUMENTS

2002/0139411 A1 10/2002 Hiraishi et al.
2010/0177380 A1 7/2010 Nagahama et al.
(Continued)

FOREIGN PATENT DOCUMENTS

JP  H10-284747 A  10/1998
JP  H11-298029 A  10/1999
(Continued)

OTHER PUBLICATIONS

Translation to English of JP 2005-259952 A via espacenet. accessed May 7, 2020. (Year: 2005).*

(Continued)

Primary Examiner — Nancy R Johnson
(74) Attorney, Agent, or Firm — Osha Bergman Watanabe & Burton LLP

(57) ABSTRACT

A glass building material according to the present disclosure includes: a first photovoltaic string of a bifacial light-receiving type which has a shape extending in one direction; a second photovoltaic string of a bifacial light-receiving type which is arranged next to the first photovoltaic string in a width direction, and which has a shape extending in the one direction; a first glass substrate which is configured to cover one surface of the first photovoltaic string and one surface of the second photovoltaic string; and a reflective film which is arranged on at least part of another surface side of the first (Continued)

photovoltaic string and another surface side of the second photovoltaic string, which has a transmittance higher than a reflectance in a visible light region, and which has a reflectance higher than a transmittance in a near-infrared region.

14 Claims, 7 Drawing Sheets

(51) Int. Cl.
*H01L 31/048* (2014.01)
*H01L 31/054* (2014.01)

(58) Field of Classification Search
CPC ............. H01L 31/0547; H01L 31/0725; H01L 31/02327; Y02E 10/52; Y02E 10/10; H02S 40/22
See application file for complete search history.

(56) References Cited

U.S. PATENT DOCUMENTS

| | | |
|---|---|---|
| 2012/0097213 A1 | 4/2012 | Weidner |
| 2013/0025655 A1* | 1/2013 | Bedell .................. H01L 31/078 136/255 |
| 2013/0319521 A1 | 12/2013 | Chida et al. |
| 2014/0083481 A1* | 3/2014 | Hebrink .................. H02S 20/26 136/246 |
| 2016/0003992 A1 | 1/2016 | Nagahama et al. |
| 2016/0329452 A1* | 11/2016 | Hahn .................. H01L 31/0236 |
| 2017/0176656 A1 | 6/2017 | Nagahama et al. |
| 2017/0363789 A1 | 12/2017 | Stalder et al. |
| 2019/0211617 A1 | 7/2019 | Umeda et al. |

FOREIGN PATENT DOCUMENTS

| | | |
|---|---|---|
| JP | H11-307791 A | 11/1999 |
| JP | 2001-127331 A | 5/2001 |
| JP | 2002-158368 A | 5/2002 |
| JP | 2002-299666 A | 10/2002 |
| JP | 2005-259952 A | 9/2005 |
| JP | 2006-173412 A | 6/2006 |
| JP | 2010-062569 A | 3/2010 |
| JP | 2010-160502 A | 7/2010 |
| JP | 2011-003834 A | 1/2011 |
| JP | 2012-134241 A | 7/2012 |
| JP | 2012-212705 A | 11/2012 |
| JP | 2017-093054 A | 5/2017 |
| WO | 2012/073806 A1 | 6/2012 |
| WO | 2016/103128 A1 | 6/2016 |
| WO | 2017/200487 A1 | 11/2017 |
| WO | 2018/056286 A1 | 3/2018 |

OTHER PUBLICATIONS

Toshio Joge et al: "Basic Application Technologies of Bifacial Photovoltaic Solar Modules"; Dengakuron B, vol. 123, No. 8, 2003 (9 pages).
Written Opinion of the International Searching Authority issued in PCT/JP2017/033822 dated Dec. 5, 2017 (4 pages).
International Search Report issued in PCT/JP2017/033822 dated Dec. 5, 2017 (3 pages).
Extended European Search Report issued in corresponding European Application No. 17853056.4, dated Apr. 6, 2020 (6 pages).

\* cited by examiner

GLASS BUILDING MATERIAL

TECHNICAL FIELD

The present invention relates to a glass building material.

BACKGROUND ART

In Non Patent Literature 1 described below, there is disclosed a bifacial light-receiving-type photovoltaic module installed vertically to the ground.

CITATION LIST

Non Patent Literature

[NPL 1] Toshio Joge et al., "Basic Application Technologies of Bifacial Photovoltaic Solar Modules," IEEJ Transactions on Power and Energy, Vol. 123, No. 8, 2003, p. 947-955

SUMMARY OF INVENTION

Technical Problem

When a conventional bifacial light-receiving-type photovoltaic module is installed in, for example, a window of a building, a power generation amount on a light-receiving surface on an interior side is small. Specifically, the light-receiving surface on the interior side, particularly a center portion thereof cannot efficiently receive solar light from outside a room, resulting in a small power generation amount.

Meanwhile, a conventional lighting-type photovoltaic module uses glass having a high solar radiation transmittance for the purpose of increasing a power generation amount, and as a result, has a problem of an increase in cooling load of a building.

The present disclosure is provided in view of the above-mentioned problems, and an object of the present disclosure is to increase a power generation amount on a light-receiving surface on an interior side when a glass building material including a photovoltaic cell is installed in, for example, a window of a building.

Another object of the present disclosure is to reduce a cooling load to achieve energy saving of the building, and to ensure a view without any feeling of oppression and improve lighting performance.

Solution to Problem (1) A glass building material according to the present disclosure includes: a first photovoltaic string of a bifacial light-receiving type which has a shape extending in one direction; a second photovoltaic string of a bifacial light-receiving type which is arranged next to the first photovoltaic string in a width direction, and which has a shape extending in the one direction; a first glass substrate which is configured to cover one surface side of the first photovoltaic string and one surface side of the second photovoltaic string; and a reflective film which is arranged on a whole or part of another surface side of the first photovoltaic string and another surface side of the second photovoltaic string, which has a transmittance higher than a reflectance in a visible light region, and which has a reflectance higher than a transmittance in a near-infrared region.

(2) In the glass building material according to the above-mentioned item (1), a distance between the reflective film and the first photovoltaic string may be 0.2 time or more as large as a width of the first photovoltaic string.

(3) The glass building material according to the above-mentioned item (1) or (2) may further include a first reflective plate which faces the another surface of the first photovoltaic string, and which has a shape extending in the one direction.

(4) In the glass building material according to the above-mentioned item (3), a width of the first reflective plate may be equal to or larger than a width of the first photovoltaic string.

(5) In the glass building material according to the above-mentioned item (3), the first reflective plate may be arranged on a surface side of the reflective film, which is not facing the first photovoltaic string.

(6) The glass building material according to any one of the above-mentioned items (1) to (5) may further include a second glass substrate which is arranged on a surface side of the reflective film, which is not facing the first photovoltaic string.

(7) The glass building material according to any one of the above-mentioned items (1) to (6) may further include a sealing material which is interposed between the first photovoltaic string and the reflective film.

(8) The glass building material according to any one of the above-mentioned items (1) to (6) may further include a third glass substrate which is interposed between the first photovoltaic string and the reflective film.

DESCRIPTION OF EMBODIMENTS

An embodiment of the present disclosure is described below with reference to the drawings.

Figure 1:
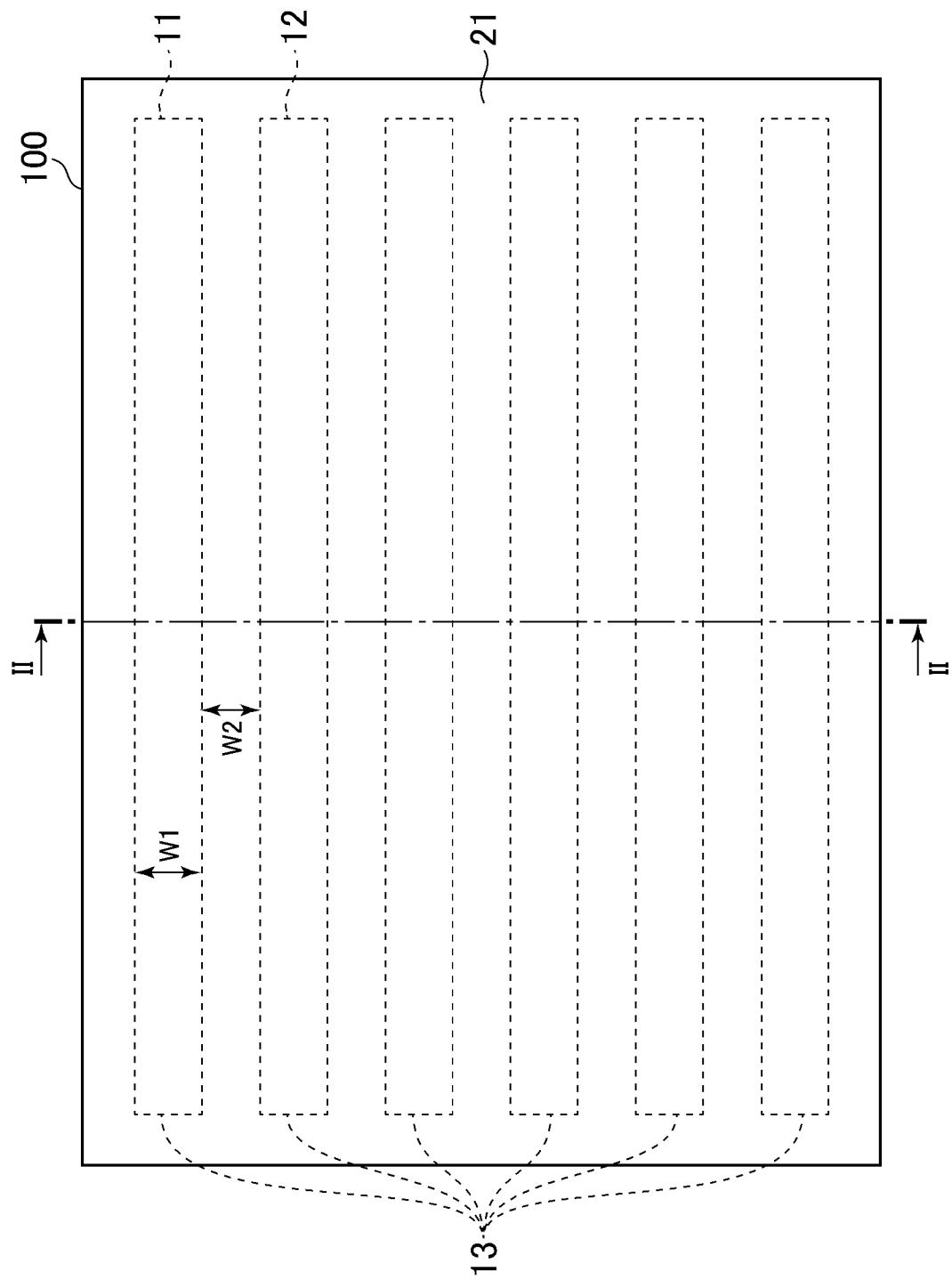
FIG. 1 is a plan view for illustrating an overview of a glass building material according to an embodiment of the present disclosure.
Figure 2:
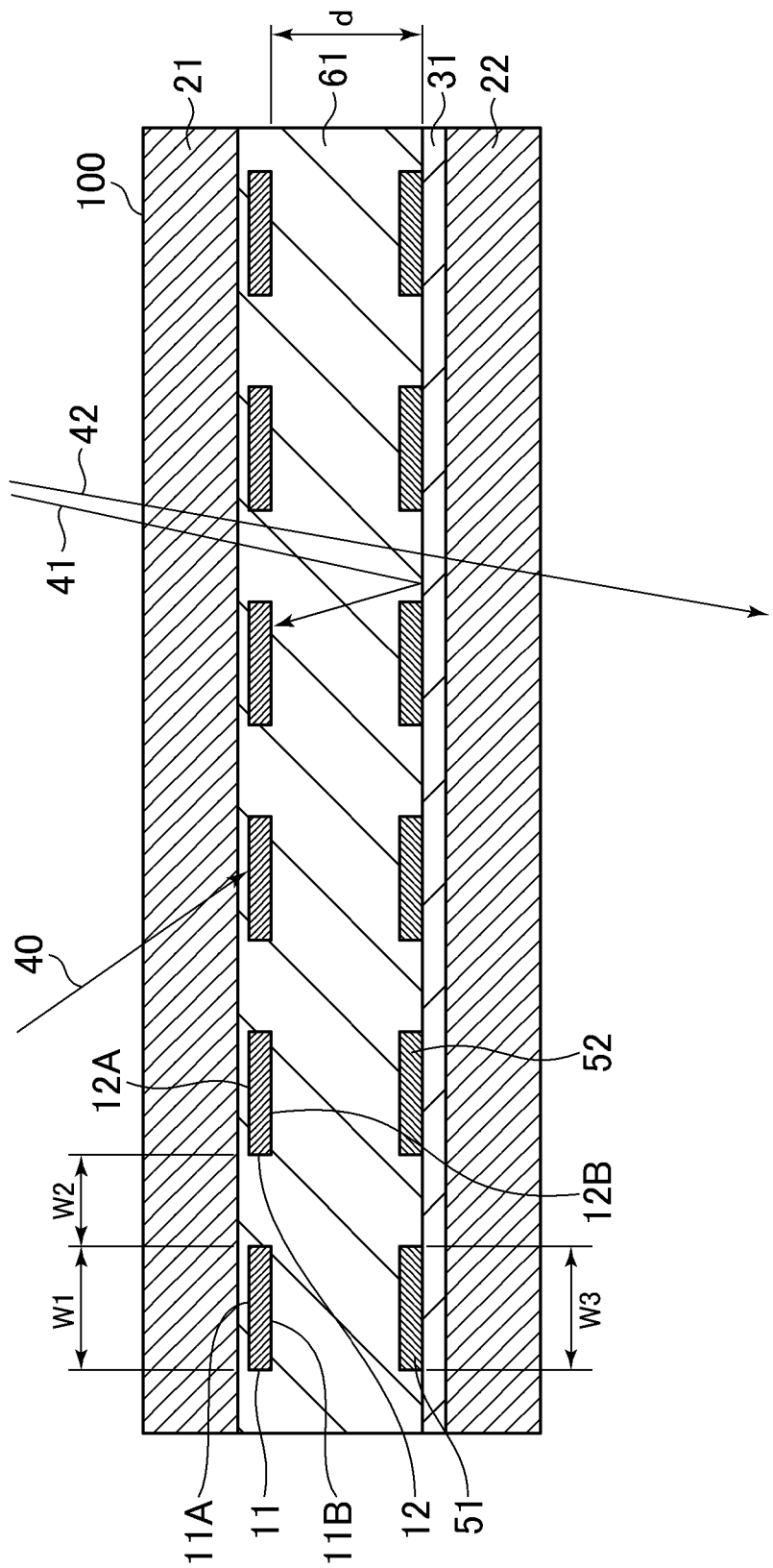
FIG. 2 is a sectional view for illustrating the overview of the glass building material according to the embodiment.

FIG. 1 is a plan view for illustrating an overview of a glass building material according to the embodiment. FIG. 2 is a sectional view for illustrating a cross-section taken along the line II-II of FIG. 1.

As illustrated in FIG. 1, a glass building material 100 includes: a plurality of photovoltaic strings 13 arranged so as to be spaced apart from one another; and a first glass substrate 21 arranged so as to cover one surface side of each of the plurality of photovoltaic strings 13. Examples of the solar batteries include monocrystalline silicon photovoltaic strings, polycrystalline silicon photovoltaic strings, and heterojunction-type photovoltaic strings. This embodiment is described using heterojunction-type photovoltaic strings as the plurality of photovoltaic strings 13.

Herein, the first glass substrate 21 is, for example, a glass substrate to be installed as a window of a building, and is formed of a material having a high transmittance so that solar light enters a room and surfaces of the photovoltaic strings.

As illustrated in FIG. 1 and FIG. 2, the plurality of photovoltaic strings 13 include a first photovoltaic string 11 and a second photovoltaic string 12. The first photovoltaic string 11 and the second photovoltaic string 12 are each formed by linearly arranging a plurality of photovoltaic cells and connecting the plurality of photovoltaic cells to one another, and each have a shape extending in one direction. The first photovoltaic string 11 has a width W1. The second photovoltaic string 12 is arranged next to the first photovoltaic string 11 in a width direction. The first photovoltaic string 11 and the second photovoltaic string 12 are arranged so as to be spaced apart from each other by a first distance W2. As apparent from FIG. 1, the width direction of the first photovoltaic string 11 and the second photovoltaic string 12 and the extending direction of the first photovoltaic string 11 and the second photovoltaic string 12 are in a relationship of intersecting with each other.

Figure 3:
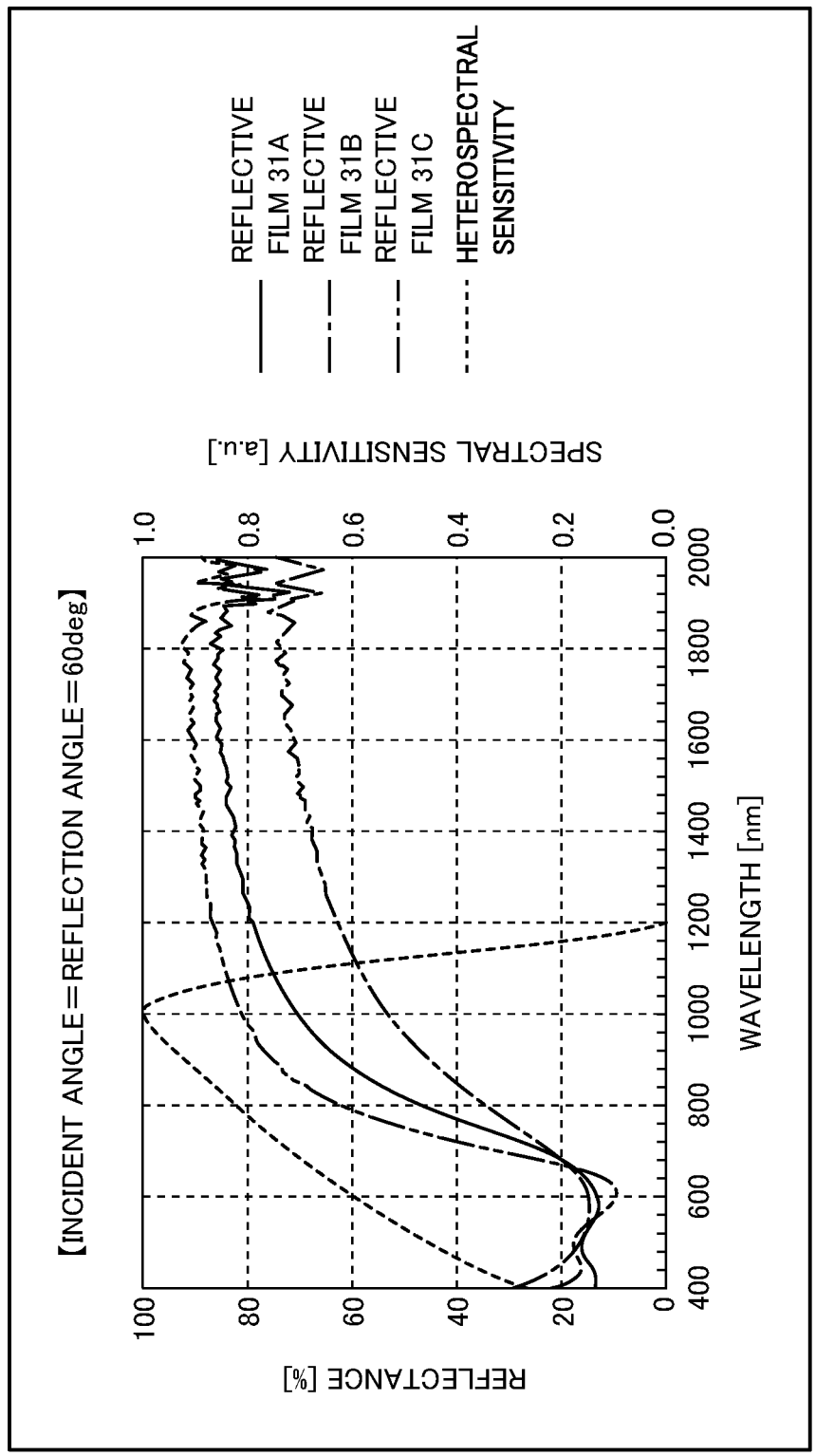
FIG. 3 is a graph for showing wavelength dependence of spectral sensitivity of a first photovoltaic string and a reflectance of a reflective film in the glass building material according to the embodiment.

As shown in FIG. 3, the first photovoltaic string 11 has relative spectral sensitivity in a range of from about 300 nm to about 1,200 nm, and the value for the relative spectral sensitivity is high around 1,000 nm in a near-infrared region. The first photovoltaic string 11 and the second photovoltaic string 12 are each of a bifacial light-receiving type, and light received on one surface 11A and one surface 12A on an exterior side and light received on another surface 11B and another surface 12B on an interior side can contribute to power generation.

As illustrated in FIG. 2, the one surface 11A of the first photovoltaic string 11 and the one surface 12A of the second photovoltaic string 12 are each configured to receive a solar light 40 from outside a room through the first glass substrate 21.

The glass building material 100 further includes, on another surface 11B side of the first photovoltaic string 11 and on another surface 12B side of the second photovoltaic string 12, a reflective film 31 arranged so as to be spaced apart from the first photovoltaic string 11 and the second photovoltaic string 12 by a second distance d. In this embodiment, the reflective film 31 is arranged on a surface of a second glass substrate 22. The reflective film 31 is, for example, a low emissivity (Low-E) film. This embodiment is described using a heat shielding Low-E film configured to transmit much of visible light and reflect much of near-infrared light.

FIG. 3 is a graph for showing wavelength dependence of the spectral sensitivity of each of the first photovoltaic string 11 and the second photovoltaic string 12, and wavelength dependence of the reflectance of the reflective film 31 (a reflective film 31A, a reflective film 31B, and a reflective film 31C) in the glass building material according to this embodiment. In this embodiment, heterojunction-type photovoltaic strings of the same kind are used as the first photovoltaic string 11 and the second photovoltaic string 12, and hence the first photovoltaic string 11 and the second photovoltaic string 12 have the same spectral sensitivity characteristics, which are represented as "heterospectral sensitivity" in FIG. 3. In addition, as shown in FIG. 3, each of the reflective film 31A, the reflective film 31B, and the reflective film 31C has a high reflectance in a near-infrared region of, for example, from 750 nm to 2,500 nm, and in the near-infrared region, has a reflectance higher than a transmittance. Meanwhile, each of the reflective film 31A, the reflective film 31B, and the reflective film 31C has a low reflectance in a visible light region of, for example, from 380 nm to 750 nm, and in the visible light region, has a transmittance higher than a reflectance.

When such reflective film 31 is arranged on the other surface 11B side of the first photovoltaic string 11, part of a near-infrared light 41 of the solar light entering from outside the room is reflected by the reflective film 31 and received on the other surface 11B of the first photovoltaic string 11 and the other surface 12B of the second photovoltaic string 12. As described above with reference to FIG. 3, the first photovoltaic string 11 and the second photovoltaic string 12 each have high spectral sensitivity characteristics in a near-infrared region, and the near-infrared light 41 reflected by the reflective film 31 can efficiently contribute to power generation.

Meanwhile, part of a visible light 42 of the solar light entering from outside the room passes through the reflective film 31, which has a low reflectance in a visible light region, to enter the room. Therefore, a view and a lighting property can be ensured through the glass building material 100.

In addition, the near-infrared light of solar radiation is reduced with the reflective film 31, and hence a cooling load is reduced, and energy saving of a building can be achieved.

With the above-mentioned configuration, while the glass building material 100 does not lose its functions of being capable of ensuring a view and a lighting property, a power generation amount on a light-receiving surface on an interior side can be increased, and a cooling load of a building can be reduced.

Figure 4:
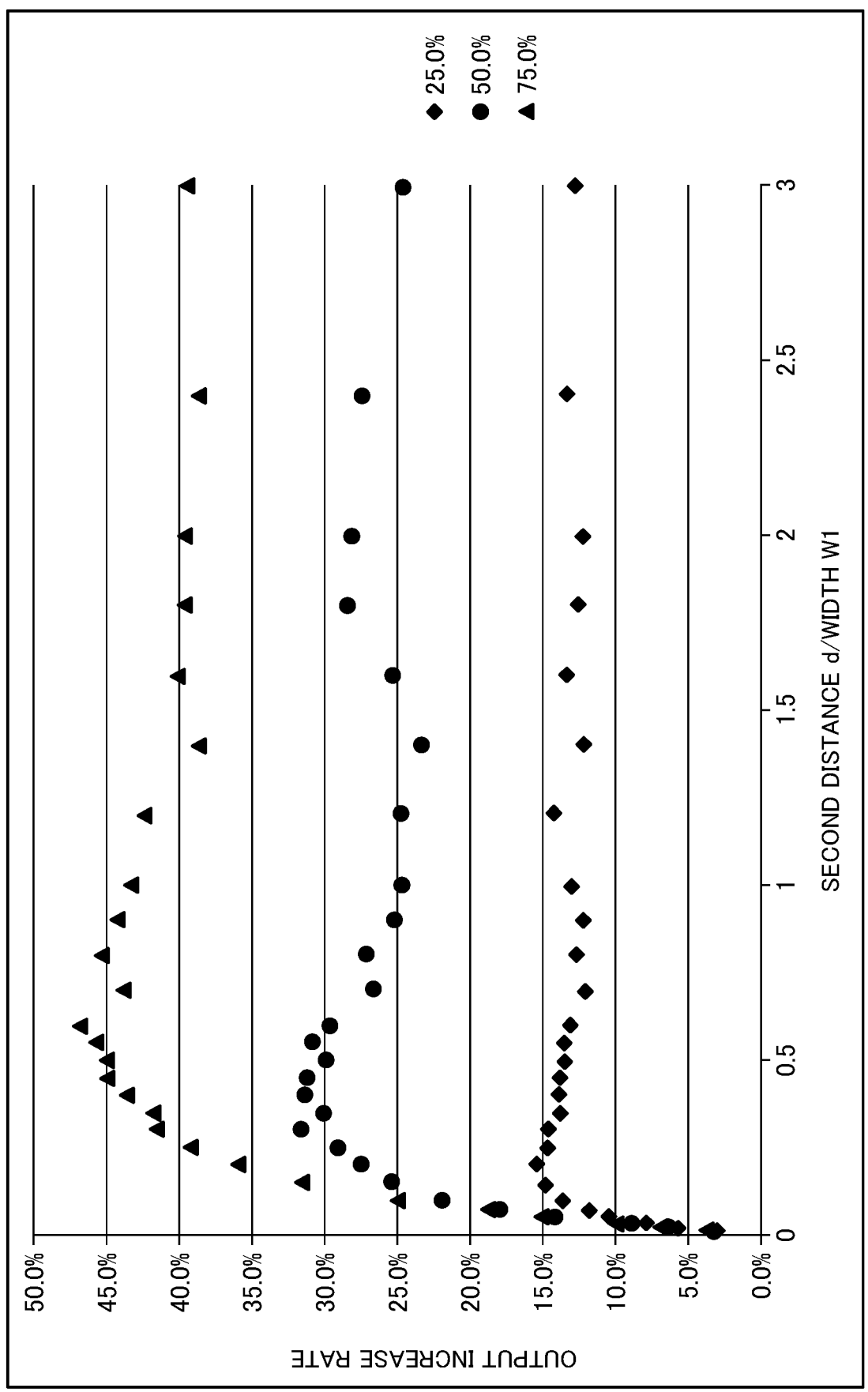
FIG. 4 is a graph for showing a relationship between: a distance between the first photovoltaic string and the reflective film according to the embodiment; and an output increase rate.

It is desired that the second distance d, which is a distance between the first photovoltaic string 11 and the reflective film 31, be 0.1 time or more as large as the width W1 of the first photovoltaic string 11. FIG. 4 is a graph for showing a relationship between the second distance d and an output increase rate of the first photovoltaic string 11 at each opening rate. As used herein, the "opening rate" refers to a value obtained by dividing the first distance W2, which is a distance between the first photovoltaic string 11 and the second photovoltaic string 12, by the sum of the width W1 of the first photovoltaic string 11 and the first distance W2. A value obtained by dividing the second distance d by the width W1 of the first photovoltaic string is shown on the abscissa. When a power generation amount on only a light-receiving surface on an exterior side is defined as 100%, a percentage of an output increase caused by power generation on the light-receiving surface on the interior side with respect to the entire power generation amount is shown on the ordinate.

As apparent from FIG. 4, when the value on the abscissa is reduced to less than 0.1, an output increase rate is abruptly reduced. This indicates that, when the second distance d is significantly reduced, it becomes difficult for the other surface 11B of the first photovoltaic string 11 to effectively receive light reflected by the reflective film 31. Accordingly, the second distance d, which is a distance between the first photovoltaic string 11 and the reflective film 31, is desirably 0.1 time or more as large as the width W1 of the first photovoltaic string 11.

It is also appropriate to adopt a configuration in which the reflective film 31 illustrated in FIG. 2 has textures on a surface thereof, and is configured to diffusely reflect the near-infrared light 41 to cause the other surface 11B of the first photovoltaic string 11 and the other surface 12B of the second photovoltaic string 12 to receive the near-infrared light 41 irrespective of the incident angle of the solar light.

In this embodiment, as illustrated in FIG. 2, a first reflective plate 51 facing the other surface 11B of the first photovoltaic string 11 and a second reflective plate 52 facing the other surface 12B of the second photovoltaic string 12 are arranged on a surface side of the reflective film 31 facing the first photovoltaic string 11.

The first reflective plate 51 and the second reflective plate 52 are each, for example, a metal plate or a white reflective plate, and can cause the other surfaces 11B and 12B to receive the near-infrared light 41 and the visible light 42 each entering from outside the room.

The first reflective plate 51 and the second reflective plate 52 each have a shape extending in one direction as with the first photovoltaic string 11 and the second photovoltaic string 12. Therefore, part of the visible light 42 of the solar light entering between the first photovoltaic string 11 and the second photovoltaic string 12 passes between the first reflective plate 51 and the second reflective plate 52 to enter the reflective film 31 described above. Accordingly, a person in the room can see a view outside the room through the glass building material 100.

When a configuration in which a width W3 of the first reflective plate 51 is set to be larger than the width W1 of the first photovoltaic string is adopted, the near-infrared light 41 and the visible light 42 each entering the first reflective plate 51 can be received on the other surface 11B of the first photovoltaic string 11 more efficiently. In addition, a light shielding property of the glass building material 100 can be increased. Further, there is a merit in terms of design seen from the interior side that the other surface 11B side of the first solar battery 11 can be hidden by the first reflective plate 51.

In this embodiment, as illustrated in FIG. 2, a sealing material 61 is arranged between: the first photovoltaic string 11 and the second photovoltaic string 12; and the reflective film 31. The sealing material 61 is formed of a thermosetting resin, such as an ethylene vinyl acetate copolymer (EVA) resin, and is configured to protect the plurality of photovoltaic strings 13 and fix the positions of the plurality of photovoltaic strings 13 in the glass building material 100.

Figure 5:
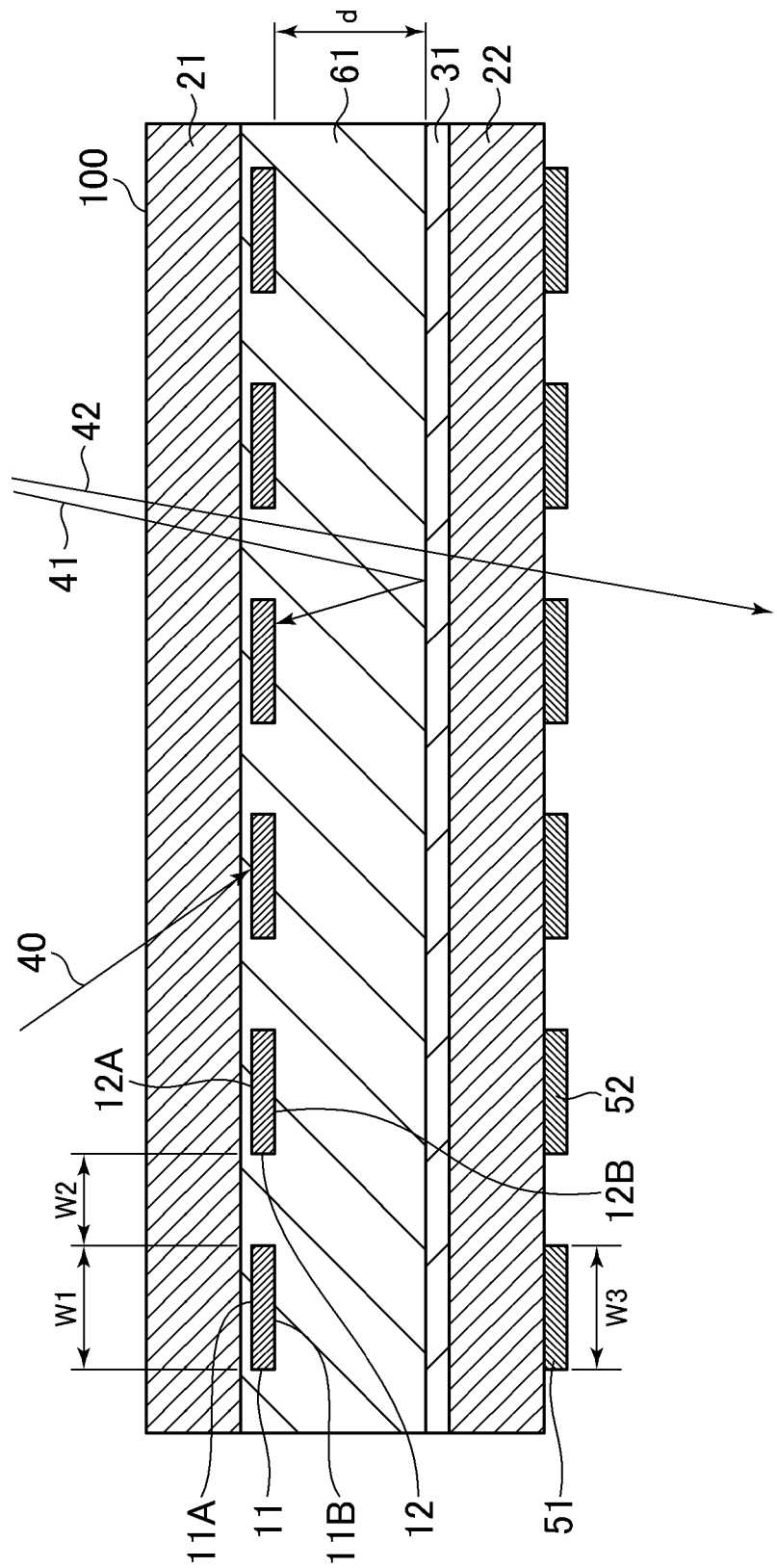
FIG. 5 is a sectional view for illustrating another example of the glass building material according to the embodiment.

While, in the configuration illustrated in FIG. 2, the first reflective plate 51 is arranged on the surface side of the reflective film 31 facing the plurality of photovoltaic strings 13, the first reflective plate 51 may be arranged on a surface side of the reflective film 31, which is not facing the plurality of photovoltaic strings 13, as illustrated in FIG. 5. In FIG. 5, the first reflective plate 51 and the second reflective plate 52 are arranged on the surface side of the reflective film 31, which is not facing the first photovoltaic string 11, through intermediation of the second glass substrate 22. With such configuration, relative positional relationships in which the positions of the first reflective plate 51 and the second reflective plate 52 are accurately matched with the positions of the first photovoltaic string 11 and the second photovoltaic string 12, respectively, can be achieved. That is, the first reflective plate 51 and the second reflective plate 52 can be arranged after the positions of the first glass substrate 21 and the second glass substrate 22 are fixed with the sealing material 61 while the positions of the first photovoltaic string 11 and the second photovoltaic string 12 are checked. Therefore, the first reflective plate 51 and the second reflective plate 52 can be accurately arranged to desired positions.

Figure 6:
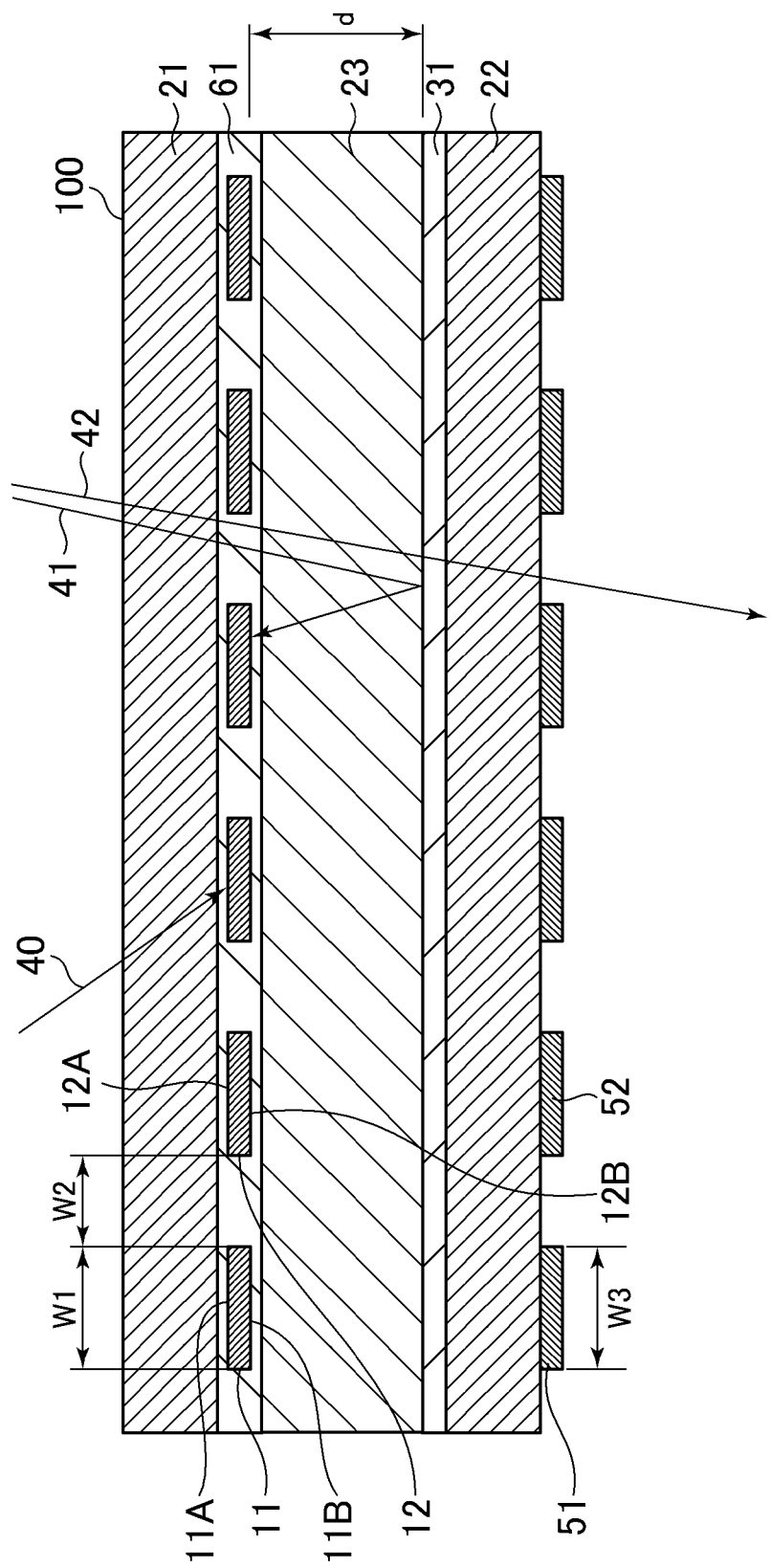
FIG. 6 is a sectional view for illustrating another example of the glass building material according to the embodiment.

As illustrated in FIG. 6, it is also appropriate to adopt a configuration in which a third glass substrate 23 is arranged between: the first photovoltaic string 11 and the second photovoltaic string 12; and the reflective film 31 instead of the sealing material 61. In this case, the sealing material 61 is interposed among the first glass substrate 21, the third glass substrate 23, the first photovoltaic string 11, and the second photovoltaic string 12, and is configured to fix the positions of these elements.

Figure 7:
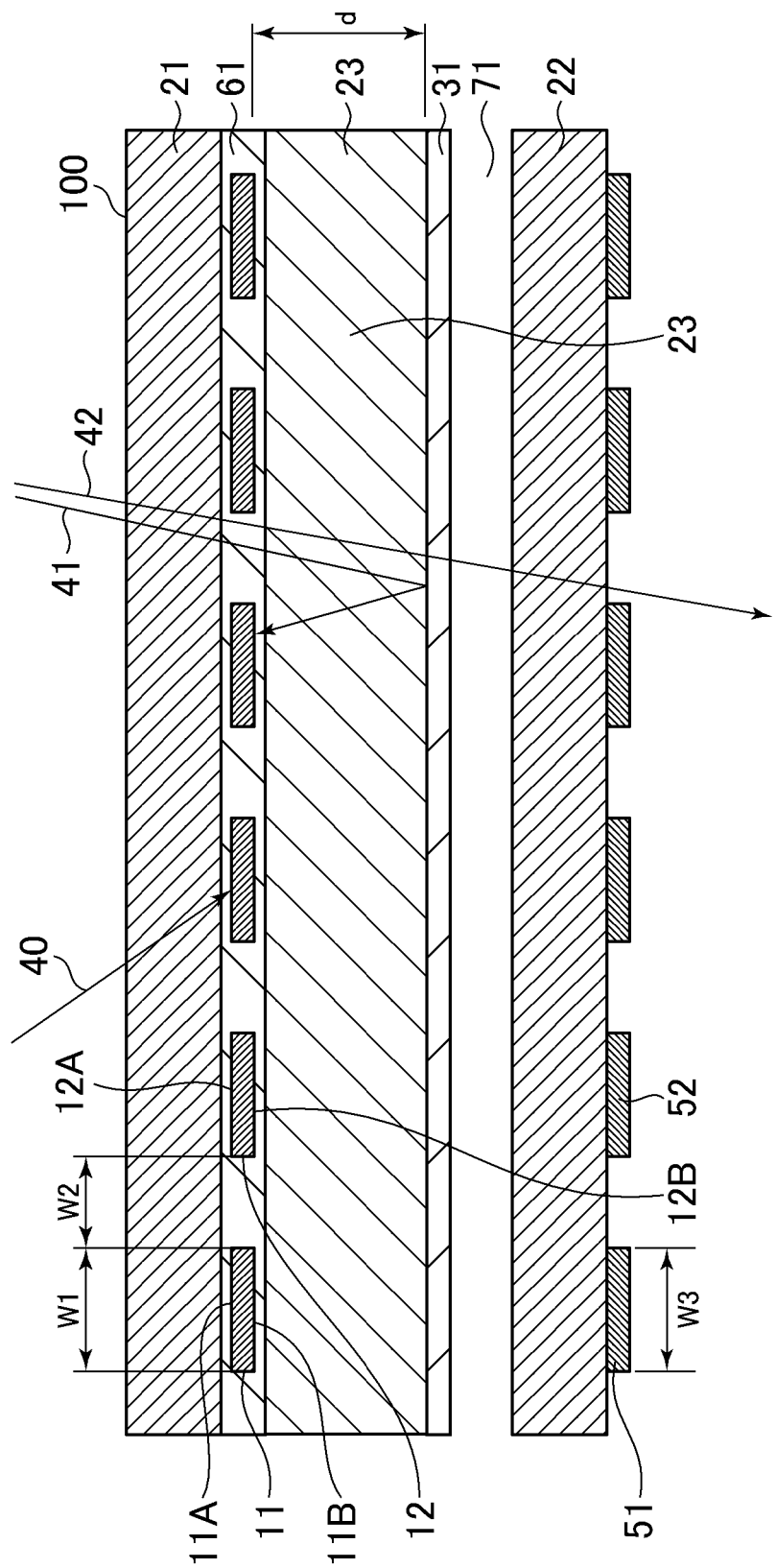
FIG. 7 is a sectional view for illustrating another example of the glass building material according to the embodiment.

As illustrated in FIG. 7, a layer having a high transmittance to the visible light 42, such as an air layer 71, may be interposed between the reflective film 31 and the second glass substrate 22.

In this embodiment, while the Low-E film is given as an example of the reflective film 31, any other film having a transmittance higher than a reflectance in a visible light region and having a reflectance higher than a transmittance in a near-infrared region may be used. For example, the reflective film 31 may be a transparent conductive oxide (TCO) film which is contrived to increase the reflectance in the near-infrared region through adjustment of a tin oxide component. In addition, the reflective film 31 may be formed of a plurality of reflective films having different reflection peaks at different wavelengths.

The invention claimed is:

1. A glass building material, comprising:
   a first photovoltaic string of a bifacial light-receiving type which has a shape extending in one direction;
   a second photovoltaic string of a bifacial light-receiving type which is arranged next to the first photovoltaic string in a width direction, and which has a shape extending in the one direction;
   a first glass substrate which is configured to cover one surface side of the first photovoltaic string and one surface side of the second photovoltaic string;
   a reflective layer including a reflective film, a first white reflective plate, and a second white reflective plate,
   wherein the reflective film is arranged on at least part of another surface side of the first photovoltaic string and another surface side of the second photovoltaic string, which has a transmittance higher than a reflectance in a visible light region, and which has a reflectance higher than a transmittance in a near-infrared region,
   wherein the first white reflective plate has a shape extending in the one direction and a width larger than the first photovoltaic string and is disposed at a position opposed to the another surface side of the first photovoltaic string so as to contact with the reflective film, and
   wherein the second white reflective plate has a shape extending in the one direction and a width larger than the second photovoltaic string and is disposed at a position opposed to the another surface side of the second photovoltaic string so as to contact with the reflective film.

2. The glass building material according to claim 1, wherein a distance between the reflective film and the first photovoltaic string is 0.1 time or more as large as a width of the first photovoltaic string.

3. The glass building material according to claim 1, wherein the first reflective plate is arranged on a surface side of the reflective film, which is not facing the first photovoltaic string.

4. The glass building material according to claim 1, further comprising a second glass substrate which is arranged on a surface side of the reflective film, which is not facing the first photovoltaic string.

5. The glass building material according to claim 4, further comprising an air layer which is interposed between the reflective film and the second glass substrate.

6. The glass building material according to claim 1, further comprising a sealing material which is interposed between the first photovoltaic string and the reflective film.

7. The glass building material according to claim 1, further comprising a third glass substrate which is interposed between the first photovoltaic string and the reflective film.

8. The glass building material according to claim 1, wherein the first photovoltaic string has spectral sensitivity at least in a wavelength range of from 300 nm to 1,200 nm.

9. The glass building material according to claim 8, wherein the first photovoltaic string comprises a heterojunction-type photovoltaic string.

10. The glass building material according to claim 1, wherein the reflective film is configured to reflect at least near-infrared light of solar light entering from the one surface side of the first photovoltaic string to cause the near-infrared light to enter the another surface of the first photovoltaic string.

11. The glass building material according to claim 10, wherein the reflective film is configured to reflect at least near-infrared light of solar light entering from the one surface side of the second photovoltaic string to cause the near-infrared light to enter the another surface of the second photovoltaic string.

12. The glass building material according to claim 10, wherein the reflective film has textures on a surface thereof, and is configured to diffusely reflect the near-infrared light to cause the near-infrared light to enter the another surface of the first photovoltaic string.

13. The glass building material according to claim 11, wherein the reflective film has textures on a surface thereof, and is configured to diffusely reflect the near-infrared light to cause the near-infrared light to enter the another surface of the first photovoltaic string and the another surface of the second photovoltaic string.

14. The glass building material according to claim 1, wherein the first white reflective plate is configured to reflect at least a near-infrared light and a visible light of solar light entering from the one surface side of the first photovoltaic string to cause the near-infrared light and the visible light to enter the another surface of the first photovoltaic string.

\* \* \* \* \*